US 7,807,503 B2

(12) United States Patent
Doan (10) Patent No.: US 7,807,503 B2
(45) Date of Patent: *Oct. 5, 2010

(54) DIE-WAFER PACKAGE AND METHOD OF FABRICATING SAME (75) Inventor: Trung T. Doan, Vellejo, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,261

(22) Filed: Aug. 19, 2008

(65) Prior Publication Data

US 2009/0011540 A1 Jan. 8, 2009

Related U.S. Application Data (60) Continuation of application No. 11/492,479, filed on Jul. 25, 2006, now Pat. No. 7,413,928, which is a division of application No. 10/767,921, filed on Jan. 29, 2004, now Pat. No. 7,122,906.

(51) Int. Cl.
H01L 21/50 (2006.01)
H01L 21/48 (2006.01)
H01L 21/44 (2006.01)
H01L 23/02 (2006.01)
H01L 23/52 (2006.01)
H01L 23/48 (2006.01)
H01L 27/146 (2006.01)

(52) U.S. Cl. .................. 438/109; 438/108; 257/686; 257/777; 257/778; 257/E27.137; 257/E27.144; 257/E27.161

(58) Field of Classification Search ............. 438/109, 438/108; 257/686, 777, 778, E27.137, E27.144, 257/E27.161
See application file for complete search history.

(56) References Cited

U.S. PATENT DOCUMENTS

| 5,362,986 | A | | 11/1994 | Angiulli et al. |
| 5,399,898 | A | | 3/1995 | Rostoker |
| 5,854,507 | A | * | 12/1998 | Miremadi et al. ........... 257/686 |
| 5,956,605 | A | | 9/1999 | Akram et al. |
| 6,084,308 | A | | 7/2000 | Kelkar et al. |
| 6,121,682 | A | * | 9/2000 | Kim ........................... 257/723 |
| 6,204,562 | B1 | | 3/2001 | Ho et al. |
| 6,229,158 | B1 | | 5/2001 | Minemier et al. |
| 6,271,598 | B1 | | 8/2001 | Vindasius et al. |
| 6,297,079 | B1 | | 10/2001 | Changey et al. |

(Continued)

Primary Examiner—Luan C Thai
(74) Attorney, Agent, or Firm—Traskbritt (57) ABSTRACT A die-wafer package includes a singulated semiconductor die having a first plurality of bond pads on a first surface and a second plurality of bond pads on a second, opposing surface thereof. Each of the first and second pluralities of bond pads includes an under-bump metallization (UBM) layer. The singulated semiconductor die is disposed on a semiconductor die site of a semiconductor wafer and a first plurality of conductive bumps electrically couples the first plurality of bond pads of the singulated semiconductor die with a first set of bond pads formed on the semiconductor die site. A second plurality of conductive bumps is disposed on a second set of bond pads of the semiconductor die site. A third plurality of conductive bumps is disposed on the singulated semiconductor die's second plurality of bond pads. The second and third pluralities of conductive bumps are configured for electrical interconnection with an external device.

20 Claims, 10 Drawing Sheets

U.S. PATENT DOCUMENTS

| | | |
|---|---|---|
| 6,379,982 B1 | 4/2002 | Ahn et al. |
| 6,392,304 B1 | 5/2002 | Butler |
| 6,407,456 B1 | 6/2002 | Ball |
| 6,703,069 B1 | 3/2004 | Moon et al. |
| 6,710,454 B1 * | 3/2004 | Boon .................. 257/777 |
| 6,768,207 B2 | 7/2004 | Tao et al. |
| 6,774,475 B2 * | 8/2004 | Blackshear et al. ......... 257/686 |
| 6,809,421 B1 | 10/2004 | Hayasaka et al. |
| 6,838,762 B2 | 1/2005 | Tao et al. |
| 7,102,219 B2 * | 9/2006 | Hanaoka et al. ............. 257/686 |
| 7,122,906 B2 | 10/2006 | Doan |
| 7,173,325 B2 * | 2/2007 | Vasoya et al. ............... 257/686 |
| 7,345,361 B2 * | 3/2008 | Mallik et al. ................ 257/686 |
| 7,413,928 B2 | 8/2008 | Doan |
| 2002/0030273 A1 | 3/2002 | Iwamoto et al. |
| 2002/0074637 A1 | 6/2002 | McFarland |
| 2002/0086459 A1 * | 7/2002 | Nakajima .................. 438/106 |
| 2005/0067714 A1 | 3/2005 | Rumer et al. |

* cited by examiner

DIE-WAFER PACKAGE AND METHOD OF FABRICATING SAME

CROSS-REFERENCE TO RELATED APPLICATIONS

This application is a continuation of application Ser. No. 11/492,479, filed Jul. 25, 2006, now U.S. Pat. No. 7,413,928, issued Aug. 19, 2008, which is a divisional of application Ser. No. 10/767,921, filed Jan. 29, 2004, now U.S. Pat. No. 7,122,906, issued Oct. 17, 2006, the disclosure of each of which is incorporated by reference herein in its entirety.

BACKGROUND OF THE INVENTION

1. Field of the Invention

The present invention relates generally to the packaging of semiconductor die and, more particularly, to a die-wafer packaging solution including multichip packages, stacked die arrangements and methods related to the fabrication thereof.

2. State of the Art

Higher performance, lower cost, increased miniaturization of components, and greater packaging density of integrated circuits are ongoing goals of the computer industry. Increased integrated circuit density is limited, in large part, by the space or "real estate" available for mounting die on a substrate such as a printed circuit board.

Conventional lead frame designs have been used in the past in the fabrication of multichip packages, but such designs inherently limit package density for a given die size because the die-attach paddle of the lead frame is conventionally larger than the die to which it is bonded. Generally speaking, the larger the die, the less space that remains around the periphery of the die-bonding pad for wire bonding. Furthermore, the wire bonding pads on a conventional lead frame provide anchorage for the leads when the leads and the die are encapsulated in plastic. Therefore, as die size is increased in relation to a given package size, there is a corresponding reduction in the space along the sides of the package for the encapsulating plastic which joins the top and bottom of the plastic body at the mold part line and anchors the leads. Thus, as the leads and encapsulant are subjected to the normal stresses of subsequent forming and assembly operations, the encapsulating plastic may crack, compromising package integrity and substantially increasing the probability of premature device failure.

More recently, chip-on-wafer or chip-on-chip designs have been implemented, using both conventional wire bonding techniques as well as some flip-chip fabrication techniques, in order to increase package density and functionality. Such packages may include the interconnection of different chips used for specific functions within the package. For example, memory chips, such as dynamic random access memory (DRAM) and/or flash memory chips, may be combined with one or more types of logic circuit chips to provide an integrated system.

Such packages may be manufactured so as to provide a package with a relatively small footprint. Generally, such packages consume less surface area on a substrate than two separately packaged semiconductor dice coupled to the same substrate. Additionally, integration of more components into an electronic system generally reduces the cost of the system as well as the overall complexity thereof.

One attempt to provide such a multichip package includes U.S. Pat. No. 6,392,304, issued May 21, 2002, to Butler. The Butler patent discloses a multichip integrated circuit including a memory chip operatively coupled with a nonmemory chip. Butler teaches that there are reduced levels of capacitance and inductance due to the chip-on-chip interface and, therefore, the resultant integrated circuit can be operated at increased speeds and at reduced levels of power consumption. However, the final package taught by Butler appears to require wire bonds from at least one of the chips to an associated lead frame. As noted above, such an arrangement generally consumes valuable real estate on a carrier substrate or other device to which the package is ultimately mounted. Furthermore, the use of a lead frame and wire bonds may limit the speed of the device for some configurations.

Multichip packages not incorporating lead frames or wire bond connections are shown in U.S. Pat. No. 6,204,562, issued Mar. 20, 2001, to Ho et al., and U.S. Pat. No. 6,084,308, issued Jul. 4, 2000, to Kelkar et al.

The Ho patent discloses a package including a first die coupled with a second die in a face-to-face arrangement using flip-chip techniques. The input/output (I/O) connections of the first die are coupled with a redistribution layer formed between the two dice. Conductive bumps are formed on the face of the second die around the periphery of the first die and function as I/O connections for the resultant package. A molding material may be disposed about the first die and the conductive bumps to form the resulting package. While providing a multichip package using flip-chip techniques, the requirement of the package I/O connections being located about the periphery of the package outward of the first die's periphery may limit the flexibility in the placement and design of the resulting array of package I/O connections.

The Kelkar patent discloses a chip-on-chip integrated circuit package which includes a first die disposed within a cavity of a substrate. A second die is mounted over the top of the first die and is electrically coupled to I/O connections of the first die as well as to bond pads on the substrate by way of solder balls disposed therebetween. The bond pads of the substrate are electrically coupled to electrical contacts, such as conductive bumps or pins, formed on an opposing surface of the substrate. The first die is attached to the substrate using a die attach material which exhibits a reflow temperature which is substantially the same as the reflow temperature of the solder balls disposed between the second die and the substrate and first die. While allowing more flexibility in configuration and design of the package I/O connections than the package disclosed by Ho, the Kelkar package requires additional materials and procedures in the fabrication thereof. For example, the Kelkar package requires an additional substrate having electrical connections on opposing surfaces thereof as well as connecting circuitry formed between the electrical connections of both surfaces. Furthermore, the resulting package appears to be significantly larger than just the continuation of the two dice because of the requirements of the additional substrate.

Thus, there is a continued desire to provide wafer-level packages providing improved density and functionality while reducing the cost to manufacture and simplifying the associated fabrication processes.

BRIEF SUMMARY OF THE INVENTION

In accordance with one aspect of the present invention, a die-wafer package is provided. The die-wafer package includes a first semiconductor die having an active surface and a plurality of bond pads disposed on the active surface. The package further includes a second semiconductor die having a first side and a second opposing side. The second semiconductor die includes a first plurality of bond pads disposed on the first side and a second plurality of bond pads disposed on the second side. The first and second pluralities of bond pads each include an under-bump metallization layer. A first plurality of conductive bumps electrically interconnects at least a first set of the bond pads disposed on the active surface of the first semiconductor die and at least some of the second plurality of bond pads of the second semiconductor die.

In accordance with another aspect of the present invention, a semiconductor device package is provided. The semiconductor device package includes at least two semiconductor dice wherein at least one of the semiconductor dice includes a first plurality of bond pads disposed on a first surface and a second plurality of bond pads disposed on a second opposing surface thereof. Each of the first and second pluralities of bond pads includes an under-bump metallization layer. A first plurality of conductive bumps electrically interconnects at least some of the first plurality of bond pads of the at least one semiconductor die with a first set of bond pads disposed on a first surface of at least one other semiconductor die.

In accordance with yet another aspect of the present invention, a multichip module is provided. The multichip module includes a carrier substrate having at least two sets of bond pads disposed on a first surface thereof. At least two semiconductor device packages are provided wherein each semiconductor device package is electrically coupled with a corresponding set of bond pads of the at least two sets of bond pads. At least one of the at least two semiconductor device packages comprises at least one semiconductor die having a plurality of bond pads on a first surface and a plurality of bond pads on a second opposing surface thereof wherein each bond pad of the two pluralities of bond pads includes an under-bump metallization layer.

In accordance with a further aspect of the present invention, a method of fabricating a semiconductor device package is provided. The method includes providing a wafer having at least one semiconductor die site, the at least one semiconductor die site having a plurality of bond pads including at least a first set of bond pads and a second set of bond pads. At least one singulated semiconductor die is provided wherein the singulated die has a first plurality of bond pads disposed on a first surface thereof and a second plurality of bond pads disposed on a second opposing surface. Each of the first and second pluralities of bond pads includes an under-bump metallization layer. A first plurality of conductive bumps is disposed between and electrically couples the first set of bond pads with at least some of the first plurality of bond pads of the at least one singulated semiconductor die.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
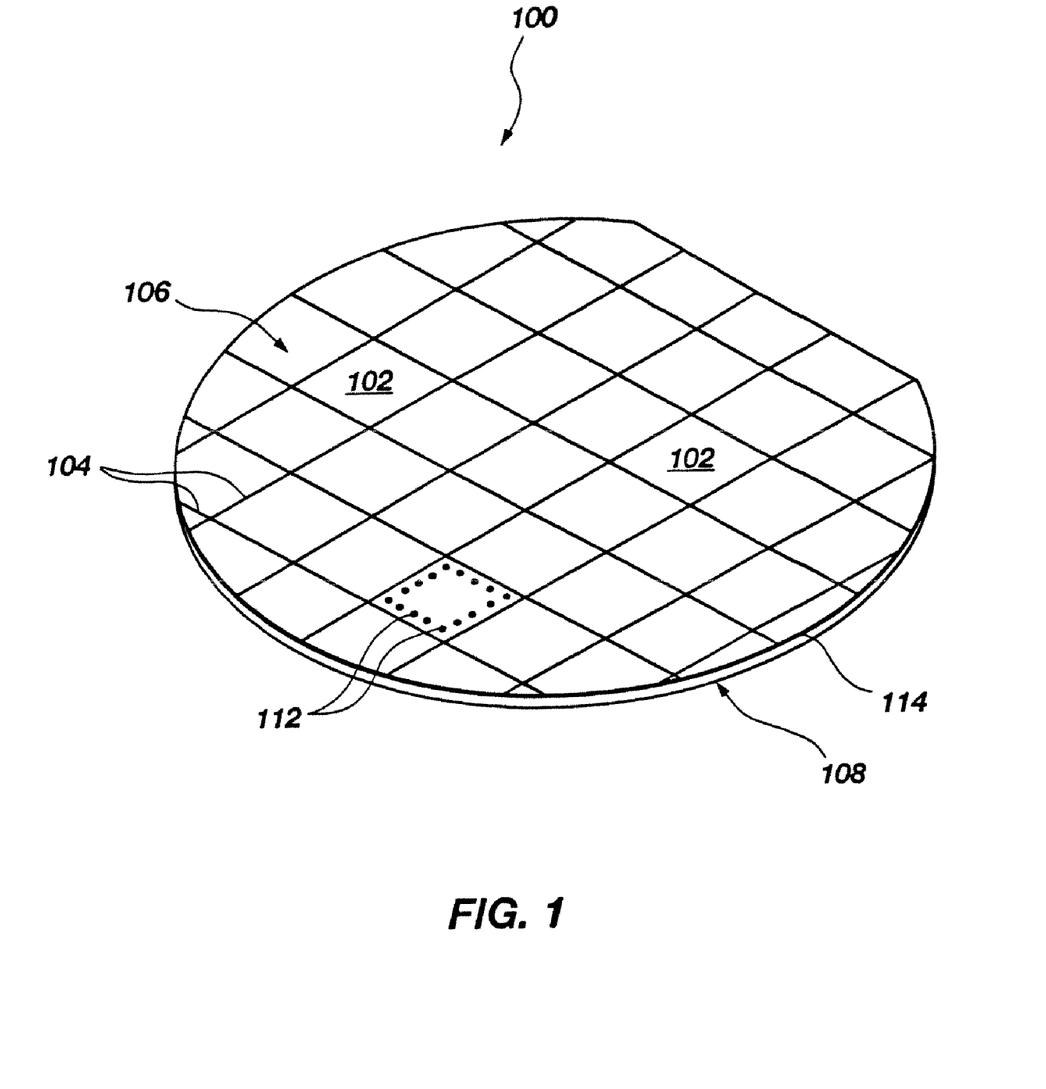
FIG. 1 is a perspective view of a semiconductor wafer containing an array of electronic devices.

Referring to FIG. 1, a semiconductor wafer 100 is shown which may be used in the fabrication of a die-wafer package according to one embodiment of the present invention. The semiconductor wafer 100 includes an array of semiconductor dice 102 (also referred to herein as "semiconductor die sites") formed thereon which may be conventionally fabricated as circuit layers (not shown) on and/or extending into the wafer 100. Discrete semiconductor devices may be identified and at least initially segregated by streets or street lines 104 as will be appreciated by those of ordinary skill in the art. The circuit layers of the wafer 100 and semiconductor dice 102 may be formed on what is referred to as an active surface 106 of the wafer 100. The opposite side or backside of the wafer 100 may remain free of circuitry and may be referred to as a passive surface 108. It is noted that the wafer 100 described herein is exemplary and that various other configurations may be utilized in the present invention.

The fabrication of the wafer 100 enables many semiconductor dice 102 to be formed and processed substantially simultaneously for subsequent separation into individual or discrete semiconductor dice as will be appreciated by those of ordinary skill in the art. Bond pads 112 may be formed on the active surface 106 of each individual or discrete semiconductor die 102 for electrical interconnection between an individual semiconductor die 102 and another electronic device such as will be described in greater detail herein below.

A first passivation layer 114 may be disposed on the active surface 106 during wafer fabrication for protection of the circuitry of the semiconductor dice 102 from external environmental elements. The first passivation layer 114 may be formed of, for example, silicon-based materials such as silicon oxides or silicon nitrides, which may be deposited by conventional sputtering or chemical vapor deposition (CVD) processes. After the first passivation layer 114 is formed on the wafer 100, the underlying bond pads 112 may be exposed through the first passivation layer 114, such as by an etching process.

Figure 2A:
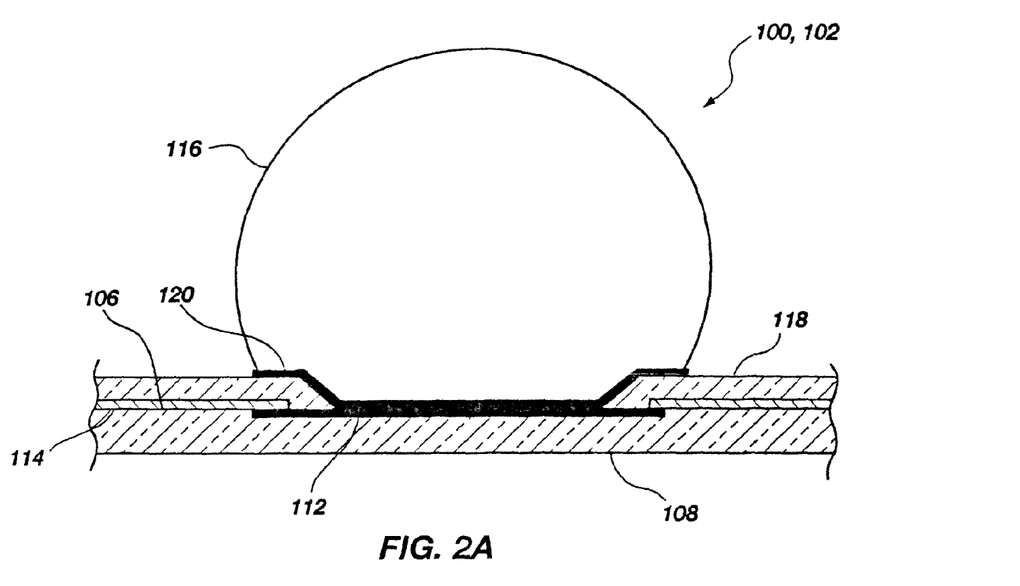
FIG. 2A is a partial sectional view of the wafer shown in FIG. 1 having conductive bumps attached in a direct bump configuration.

Referring to FIG. 2A, a partial sectional view of the wafer 100 and, more particularly, of a semiconductor die 102 is shown. Conductive bumps 116 may be formed on the active surface 106 of the wafer 100 in a direct bump configuration over bond pads 112 of the semiconductor die 102. A second passivation layer 118 may be deposited over the first passivation layer 114, and an under-bump metallization (UBM) layer 120 may be formed on the bond pads 112 and also to overlap a portion of the first and second passivation layers 114, 118. Conductive bumps 116 are then attached to the UBM layer 120 directly over the bond pads 112, which may include one or more layers of solder wettable material or other barrier layers of material thereon. Conductive bumps 116 may be formed using known techniques such as screen printing or by ball bumping with wire bonding equipment. Exemplary materials for conductive bumps 116 may include gold, eutectic tin/lead solder, and conductive or conductor-filled epoxies. Furthermore, while described in terms of bumps, it should be understood that conductive bumps 116 may be configured as balls, columns, pillars, or other desired geometrical configurations.

Figure 2B:
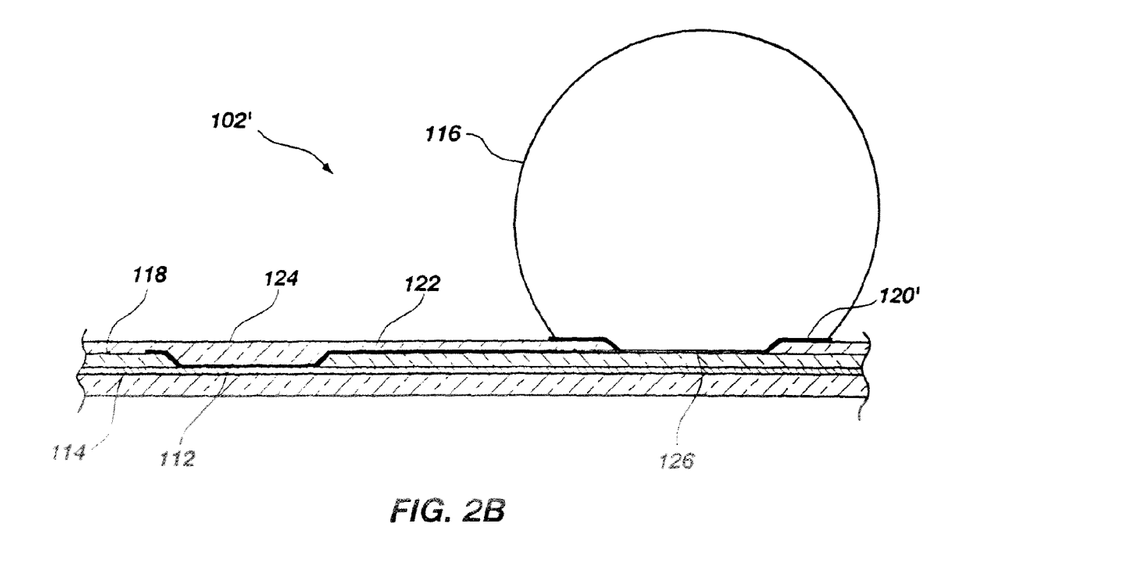
FIG. 2B is a partial sectional view of a wafer having a redistribution layer and associated conductive bumps.

Referring briefly to FIG. 2B, a partial sectional view of a semiconductor die 102' according to another embodiment of the present invention is shown. A redistribution layer (RDL) may be used to relocate connection points for the bond pads 112 of the individual semiconductor die 102'. This may be required when the bond pads 112 of a semiconductor die 102' are not configured in a suitable pattern for attachment or are too closely spaced to allow effective formation of the conductive bumps 116. Thus, subsequent to depositing the second passivation layer 118, redistribution circuits 122 may be formed thereon. The redistribution circuits 122 may be deposited as a layer of metal, polysilicon or other conductive material on the second passivation layer 118 and etched to form a desired circuit pattern. Next, a third passivation layer 124 may be deposited over the redistribution circuits 122 using similar materials and deposition techniques as with the first and second passivation layers 114, 118. The third passivation layer 124 may then be etched to expose new bump connection locations 126 on the redistribution circuits 122. A UBM layer 120' may be formed to cover the bump connection locations 126 and overlap a portion of the third passivation layer 124. The conductive bumps 116 are attached to UBM layer 120' directly over bump connection locations 126.

While FIGS. 2A and 2B illustrate an exemplary conductive bump 116 and associated connection structure, it is noted that multiple sets of conductive bumps may be formed on the semiconductor devices 102 of the wafer 100. Each set of conductive bumps may exhibit characteristics which differ from other sets of conductive bumps formed on the same semiconductor die 102. For example, a first set of conductive bumps may be formed of a first material while the second set of conductive bumps may be formed of a second material. Also, the conductive bumps of one set may be of a first geometric configuration, size and/or volume which is different from the conductive bumps of another set of the same semiconductor die 102.

Figure 3A:
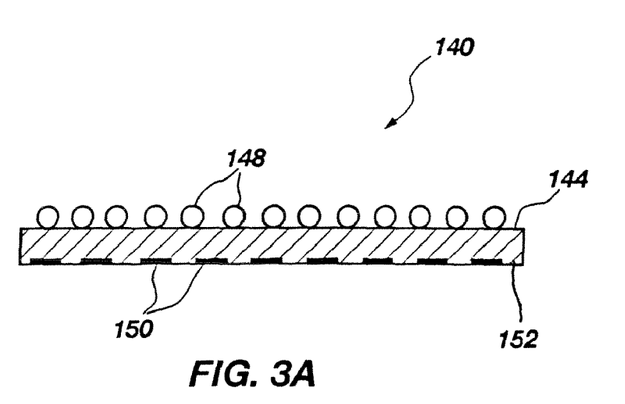
FIGS. 3A and 3B show partial sectional views of a singulated semiconductor die which may be utilized in an embodiment of the present invention.
Figure 3B:
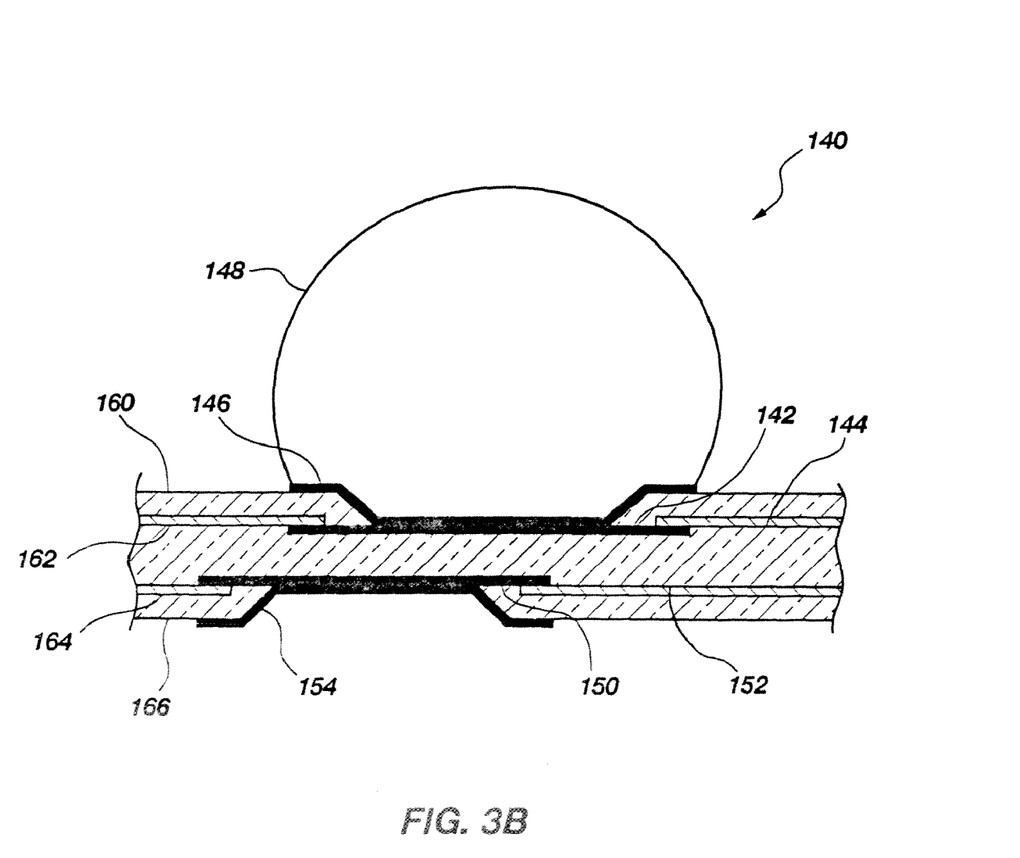

Referring now to FIGS. 3A and 3B, FIG. 3A shows a partial sectional view of a singulated semiconductor die 140 and FIG. 3B shows an enlarged view of a portion of the singulated die 140. The singulated die 140 may include a plurality of bond pads 142 formed on a first surface 144 or upper side of the die. A UBM layer 146 may be formed over the bond pads 142 with conductive bumps 148 being formed over the UBM layer 146. As with the wafer 100 described above with respect to FIGS. 1, 2A and 2B, the UBM layer 146 may be formed of a solder wettable material or other barrier material and the conductive bumps 148 may be formed of a material such as gold, eutectic tin/lead solder, conductive or conductor-filled epoxies or another appropriate conductive material.

The singulated die 140 may further include a plurality of bond pads 150 formed on a second surface 152 or underside of the die 140. A UBM layer 154 may also be formed over the bond pads 150 on the second surface 152. One or more of the bond pads 142 formed on the first surface 144 may be in electrical communication with one or more bond pads 150 formed on the second surface 152 through circuitry (not shown) formed within the die 140. However, if so desired, each bond pad 142 and 150 may act as a discrete I/O connection depending, for example, on the desired function of the die 140. The formation of bond pads 142 and 150 with associated UBM layers 146 and 154 on opposing surfaces 144 and 152 of the singulated die 140 provides considerable flexibility in forming a multichip package.

The singulated die 140 may be fabricated in a manner generally similar to the wafer 100 shown and described with respect to FIGS. 1, 2A and 2B including the formation of various passivation layers 160, 162, 164 and 166. Additionally, while not specifically shown in FIGS. 3A and 3B, redistribution layers may be formed in the singulated die 140 as will be appreciated by those of ordinary skill in the art.

It is noted that the singulated die 140 shown and described with respect to FIGS. 3A and 3B, and the semiconductor dice 102 on the wafer 100 shown and described with respect to FIGS. 1, 2A and 2B, may be similar or dissimilar devices. In other words, the singulated die 140 and the semiconductor dice 102 may each be configured, for example, as a memory device or one device may be configured, for example, as a memory device while the other is configured as a logic device.

Figure 4A:
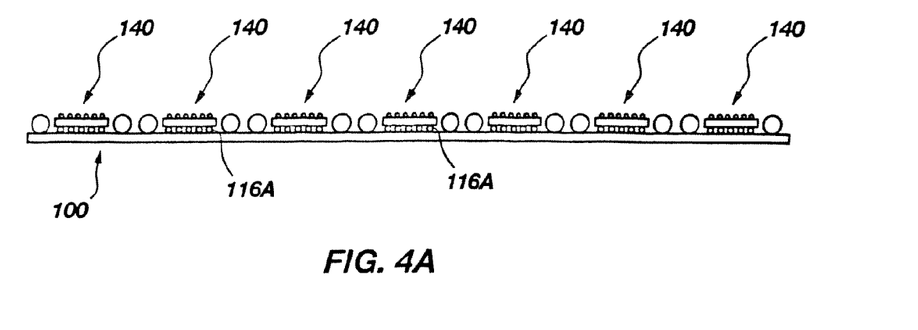
FIGS. 4A and 4B show elevational views of a plurality of singulated semiconductor dice coupled to a wafer in accordance with an aspect of the present invention.
Figure 4B:
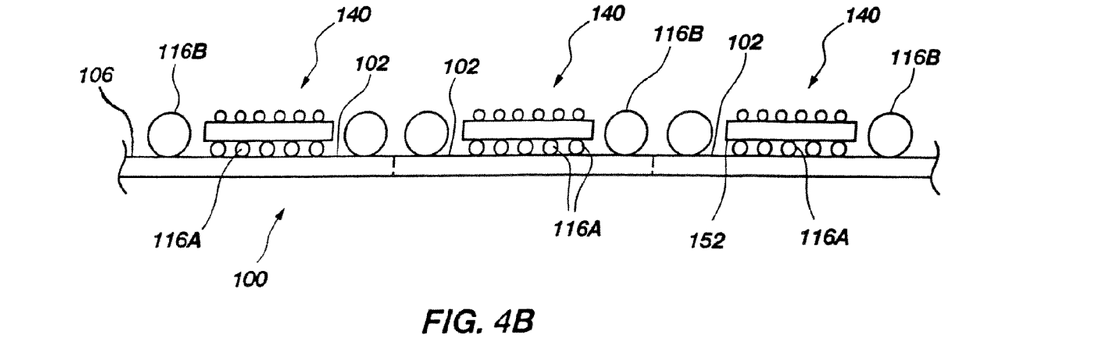

Referring now to FIGS. 4A and 4B, a plurality of singulated dice 140 is disposed on the wafer 100 over corresponding semiconductor dice 102. The singulated die 140 may be electrically coupled to their respective semiconductor devices 102 by contacting a first set of conductive bumps 116A formed on the surface of the semiconductor die 102 with the UBM-covered bond pads 150, 154 (FIGS. 3A and 3B) on the second surface 152 of the singulated die 140 and forming an appropriate electrical connection therebetween using flip-chip fabrication techniques. A second set of conductive bumps 116B, which are generally larger in volume, or at least taller in height, than the first set of conductive bumps 116A, may be formed and located on UBM-covered bond pads 112, 120 (FIGS. 1, 2A and 2B) of the semiconductor dice 102 such that they are not directly electrically coupled with the singulated die 140.

It is noted that, in some embodiments, the second set of conductive bumps 116B and the bond pads 142 on the first surface 144 of the singulated semiconductor die 140 may terminate at their respective upper ends at substantially the same height or distance above the wafer's active surface 106. However, as will be discussed in further detail below, such may depend on the geometric configuration of the conductive bumps 148 and 116B.

Figure 5A:
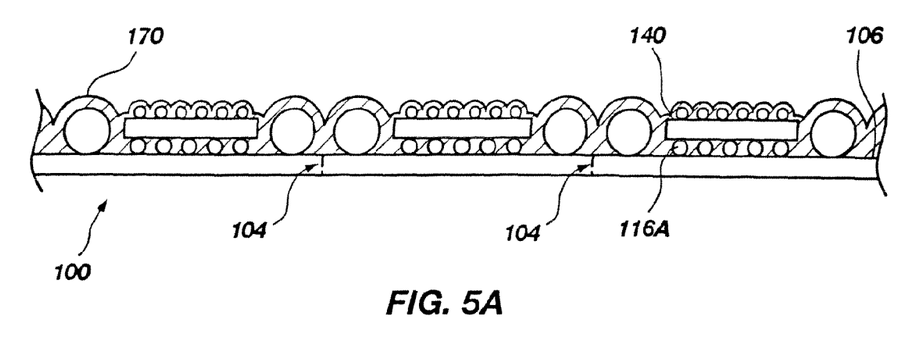
FIGS. 5A-5C show partial sectional views of the assembly of FIGS. 4A and 4B at various stages of fabrication, including a resultant multichip package, in accordance with an aspect of the present invention.

Referring now to FIG. 5A, a passivation layer 170 may be formed over the wafer 100 and the plurality of singulated die 140 coupled therewith. The passivation layer 170 may be formed, for example, of an appropriate glass material, silicon nitride or silicon oxide or as a layer of epoxy or other polymer material to protect the resulting packages from external environmental elements. While shown to be contiguous with the passivation layer 170 for purposes of convenience in illustration, a layer of underfill material may be disposed between the active surface 106 of the wafer 100 and the singulated die 140 about the first set of conductive bumps 116A.

Figure 5B:
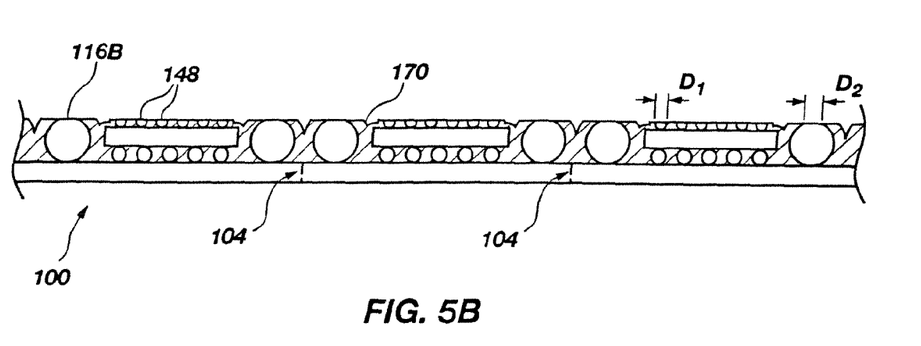

Referring to FIG. 5B, the passivation layer 170 may be subjected to an appropriate planarization process or other material removal process to expose a portion of the upper surfaces of the second set of conductive bumps 116B and the conductive bumps 148 formed on the first surface 144 of the singulated die 140. Such a process may include, for example, a mechanical grinding process or other mechanical planarization process, a chemical-mechanical planarization process (CMP), a chemical planarization process or an etching process. It is noted that the second set of conductive bumps 116B and the conductive bumps 148 formed on the first surface 144 of the singulated die 140 may each be sized, located and configured such that, when a portion of each is exposed by way of an appropriate planarization or other material removal process, the exposed portion of each set of conductive bumps 116B, 148 exhibits a substantially similar surface area which is configured for subsequent electrical connection with, for example, a carrier substrate or other electronic device. This may be accomplished even if the conductive bumps 116B and 148 are of different relative sizes or geometrical configurations.

For example, assuming that the conductive bumps 116B and 148 are each configured as conductive balls, they may be sized, located and configured such that, when subjected to the above-referenced material removal process, the conductive bumps 148 formed on the first surface 144 of the singulated die 140 are exposed down to a level which is at or near their midsections. This would provide the maximum surface area for such conductive bumps 148 as indicated generally by the exposed diameter $D_1$. On the other hand, the second set of conductive bumps 116B may only have the tips thereof exposed as a result of the material removal process, thereby providing a surface area for the second set of conductive bumps 116B which is indicated generally by the exposed diameter $D_2$. In one embodiment, the conductive bumps 116B and 148 may be sized, located and configured such that their respective exposed diameters $D_2$, and $D_1$, will be substantially equal, thereby rendering substantially equal exposed surface areas.

In other configurations, if it is desired to have the conductive bumps 116B and 148 exhibit substantially equal exposed surface areas, the exposed conductive bumps 116B and 148 may be configured as conductive columns, each exhibiting similar diameters. In another configuration, one set of conductive bumps 116B and 148 may exhibit one geometric configurations (e.g., a conductive ball) while another set may exhibit another geometric configuration (e.g., a conductive column) while still providing substantially similar exposed surface areas.

Figure 5C:
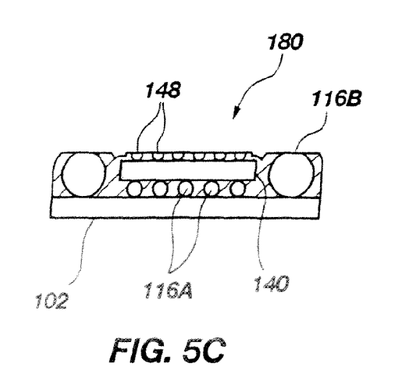
Figure 5D:
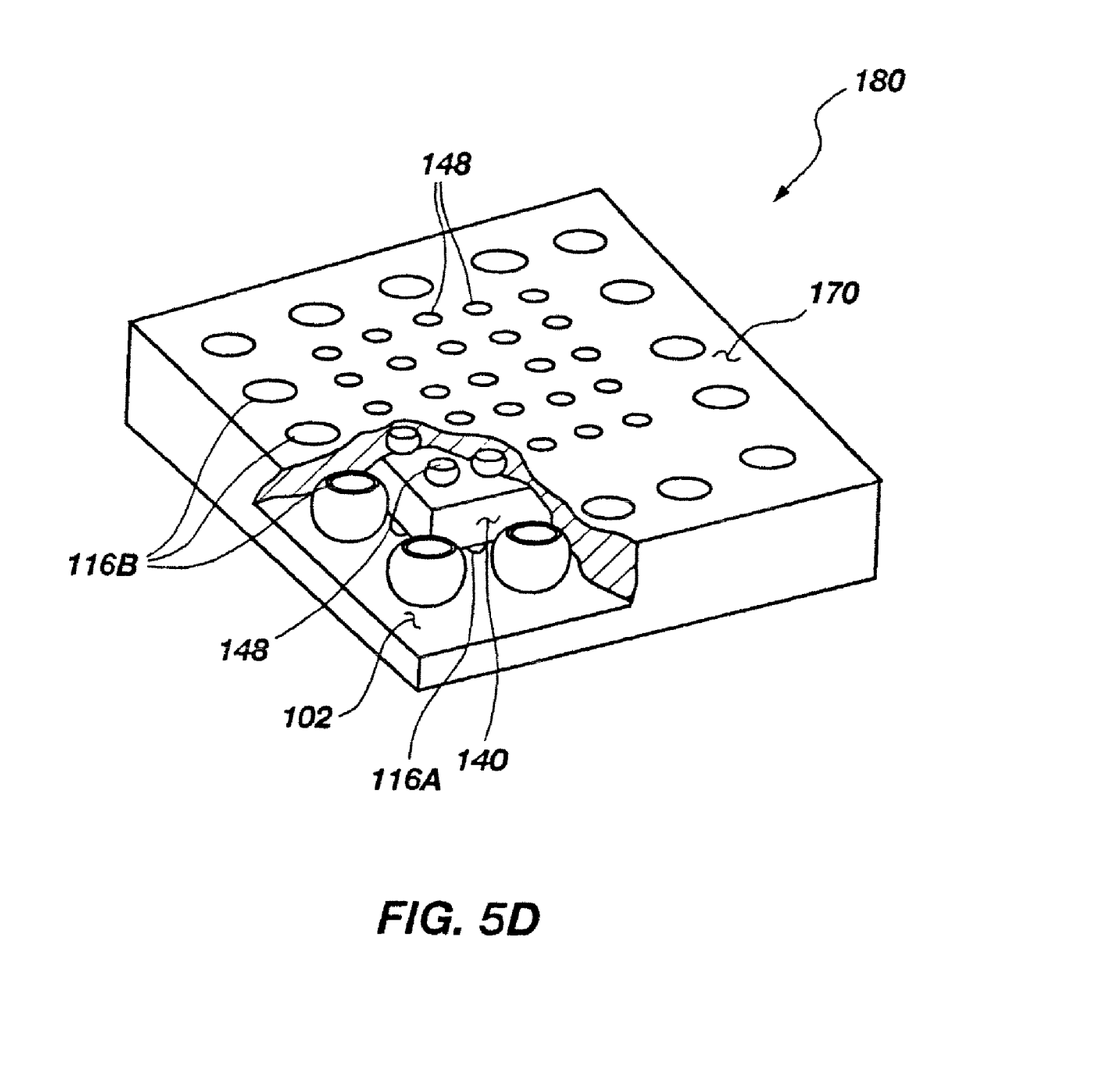
FIG. 5D shows a partial sectional perspective view of the multichip package shown in FIG. 5C.

Referring now to FIGS. 5C and 5D, a multichip package 180 is shown after singulation thereof. Singulation may be accomplished by, for example, scoring or cutting the wafer with a wafer saw along the street lines 104 (indicated by dashed lines in FIGS. 5A and 5B). The resulting multichip package 180 includes two discrete devices (semiconductor die 102 and previously singulated die 140) coupled directly to one another by way of conductive bumps 116A wherein each discrete device is also configured for direct coupling with, for example, a carrier substrate by way of conductive bumps 116B and 148 respectively. The use of conductive bumps 116A, 116B and 148 and UBM layers 120, 146 and 154 (see FIGS. 2A and 3B) throughout the multichip package 180 provides for faster and more reliable interconnections. Furthermore, such interconnections provide for a multichip package 180 which exhibits an overall reduced size.

Figure 6:
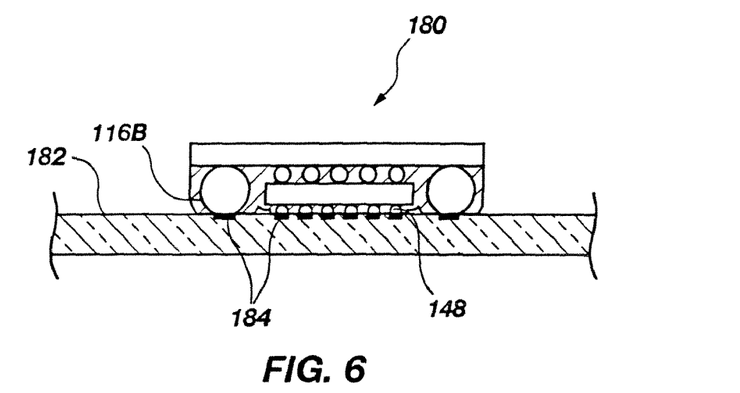
FIG. 6 is an elevational view showing a multichip package attached to a carrier substrate in accordance with an aspect of the present invention.

Referring briefly to FIG. 6, the multichip package 180 may be mounted, for example, to a carrier substrate 182, such as a printed circuit board, using flip-chip techniques such that the exposed portions of conductive bumps 116B and 148 are electrically coupled with the bond pads 184 of the carrier substrate 182. In one embodiment, a plurality of multichip packages 180 may be mounted to the same carrier substrate to form, for example, a memory module.

As previously noted, the multichip package 180 may be formed using similar device types (e.g., the semiconductor die 102 and singulated die 140 both being memory devices) or each being a distinct type of device (e.g., one being a memory device and the other being a logic device). Thus, a variety of arrangements may be employed providing considerable flexibility in the design of the multichip package with regard to its intended use.

Figure 7:
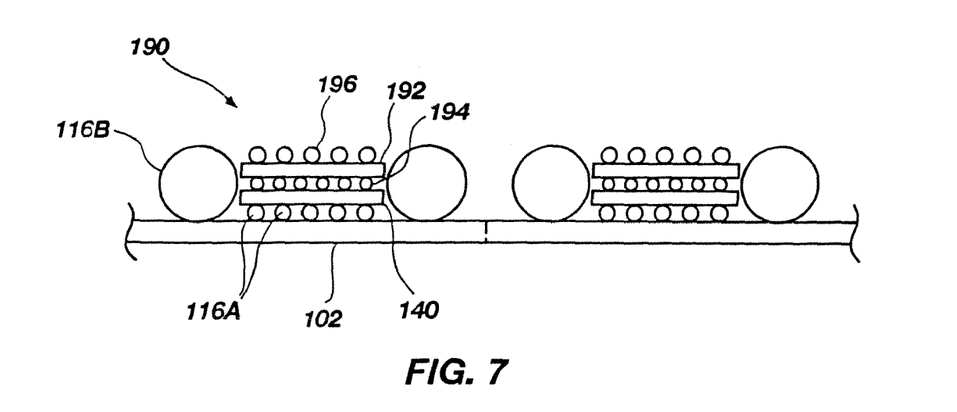
FIG. 7 is an elevational view of a multichip package during fabrication in accordance with another embodiment of the present invention.

Referring now to FIG. 7, a multichip package in the form of a stacked semiconductor arrangement 190 according to another embodiment of the present invention is shown wherein a first singulated die 140 is electrically coupled to a semiconductor die 102 by way of a first set of conductive bumps 116A. A second set of conductive bumps 116B is provided for direct electrical interconnection between the semiconductor die 102 and an external device such as a carrier substrate. A second singulated chip 192 is coupled to the first singulated die 140 by way of conductive bumps 194. Another set of conductive bumps 196 is disposed on top of the second singulated chip 192 and configured for direct electrical interconnection with an external device.

Figure 8:
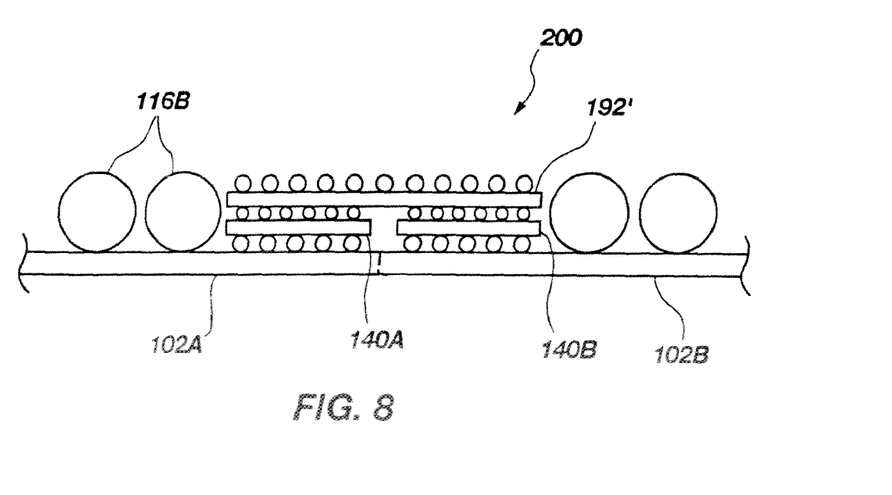
FIG. 8 is an elevational view of a multichip package utilizing multiple semiconductor dice of a wafer in accordance with another embodiment of the present invention.

Referring to FIG. 8, a multichip package in the form of a stacked semiconductor arrangement 200 according to yet another embodiment of the present invention is shown wherein a plurality of singulated dice 140A and 140B, each being electrically coupled to an associated semiconductor die 102A and 102B respectively, are bridged by, and electrically coupled to, a second common singulated chip 192'. Thus, a resulting package would include both semiconductor dice 102A and 102B. Conductive bumps 116B may again provide direct electrical interconnection between the semiconductor dice 102A and 102B and an external device. As with other embodiments described herein, the semiconductor dice 102A and 102B and the singulated dice 140A, 140B and second singulated chip 192' may include similar types of devices or may include a mixture of differing types of devices.

Figure 9:
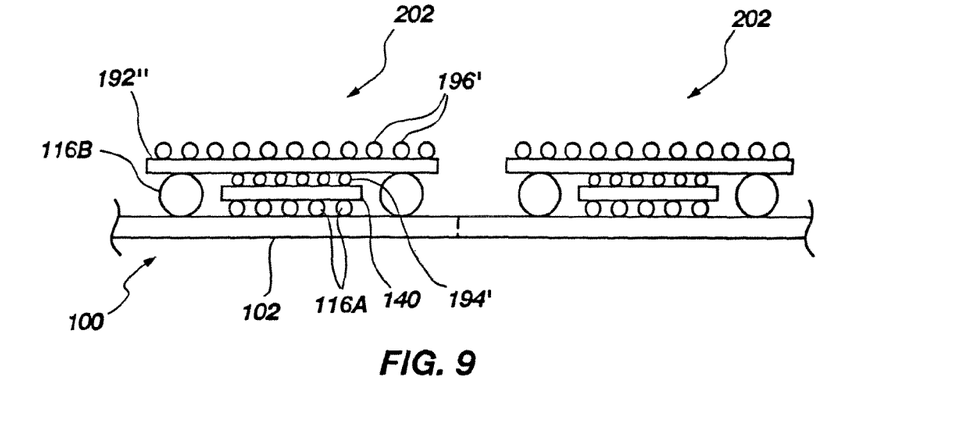
FIG. 9 is an elevational view of another multichip package during the fabrication thereof in accordance with yet another embodiment of the present invention.

Referring to FIG. 9, a multichip package in the form of a stacked semiconductor arrangement 202 is shown in accordance with a further embodiment of the present invention wherein a first singulated die 140 is electrically interconnected with the semiconductor die 102 of a wafer 100 by way of a first set of conductive bumps 116A. A second singulated chip 192" is electrically interconnected to the semiconductor die 102 by way of a second set of conductive bumps 116B and also electrically interconnected with the first singulated die 140 by way of another set of conductive bumps 194'. Conductive bumps 196' are also formed on the upper surface of the second singulated chip 192" and configured for electrical interconnection with an external device.

Figure 10:
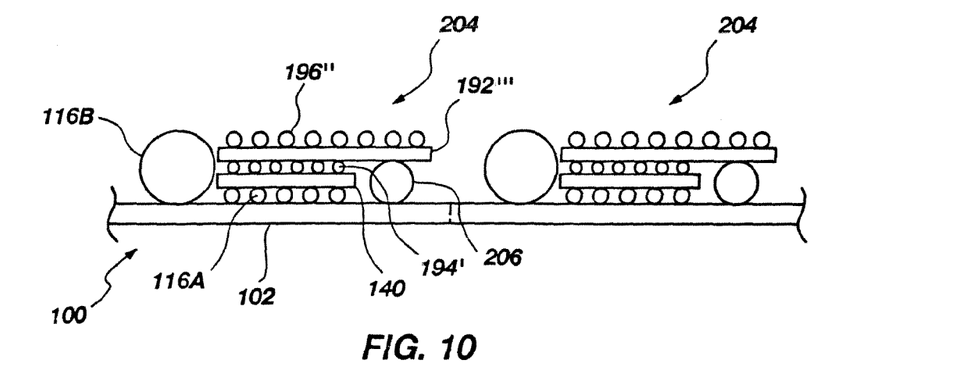
FIG. 10 is an elevational view of yet another multichip package during the fabrication thereof in accordance with a further embodiment of the present invention.

Referring to FIG. 10, a multichip package in the form of a stacked semiconductor arrangement 204 is shown in accordance with yet a further embodiment of the present invention wherein a first singulated die 140 is electrically interconnected with the semiconductor die 102 of a wafer 100 by way of a first set of conductive bumps 116A. A second set of conductive bumps 116B is configured to provide direct electrical interconnection between the semiconductor die 102 and an external device. A second singulated chip 192''' is electrically interconnected with the first singulated die 140 by way of conductive bumps 194' and is also electrically interconnected with the semiconductor die 102 by way of conductive bumps 206. Conductive bumps 196'' are formed on the upper surface of the second singulated chip 192''' and configured for electrical interconnection with an external device.

Figure 11:
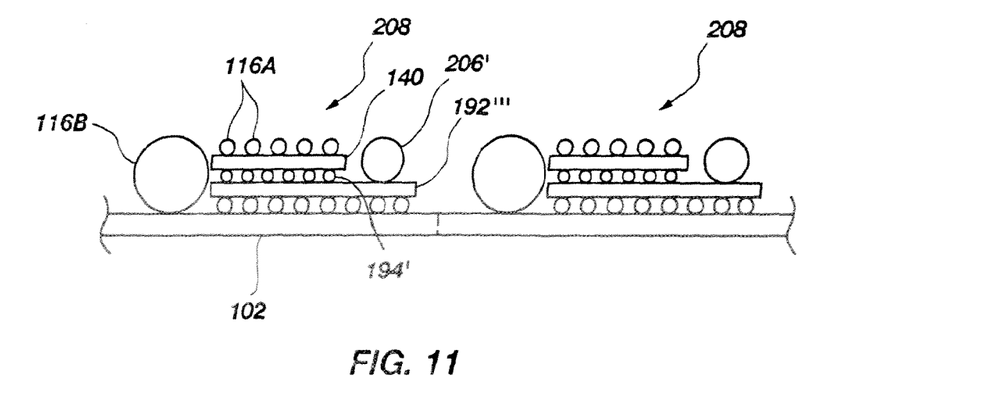
FIG. 11 is an elevational view of a multichip package during the fabrication thereof in accordance with yet a further embodiment of the present invention.

Referring now to FIG. 11, another multichip package in the form of stacked semiconductor arrangement 208 is shown wherein the arrangement 208 is similar to that which is shown and described with respect to FIG. 10, except that the first singulated die 140 and second singulated chip 192''' are reversed in their positions within the stacked arrangement 208 and conductive bumps 206' are configured to electrically interconnect the second singulated chip 192''' with an external device rather than with the semiconductor die 102. The embodiment of FIG. 11 enables each die or device (102, 140, 192''') to be directly connected with an external device using flip-chip mounting techniques. More particularly, semiconductor die 102 may be electrically interconnected with an external device by way of conductive bumps 116B, the first singulated die 140 may be electrically interconnected with an external device by way of conductive bumps 116A, and the second singulated chip 192''' may be electrically interconnected with an external device by way of conductive bumps 206'.

It is noted that the stacked arrangements shown in FIGS. 7-11 are shown at an intermediate stage of fabrication and that, as described above herein with respect to other embodiments, a passivation layer or other encapsulant material may be disposed over the stacked arrangements and that each stacked arrangement may be subsequently singulated into a discrete semiconductor device package.

Figure 12:
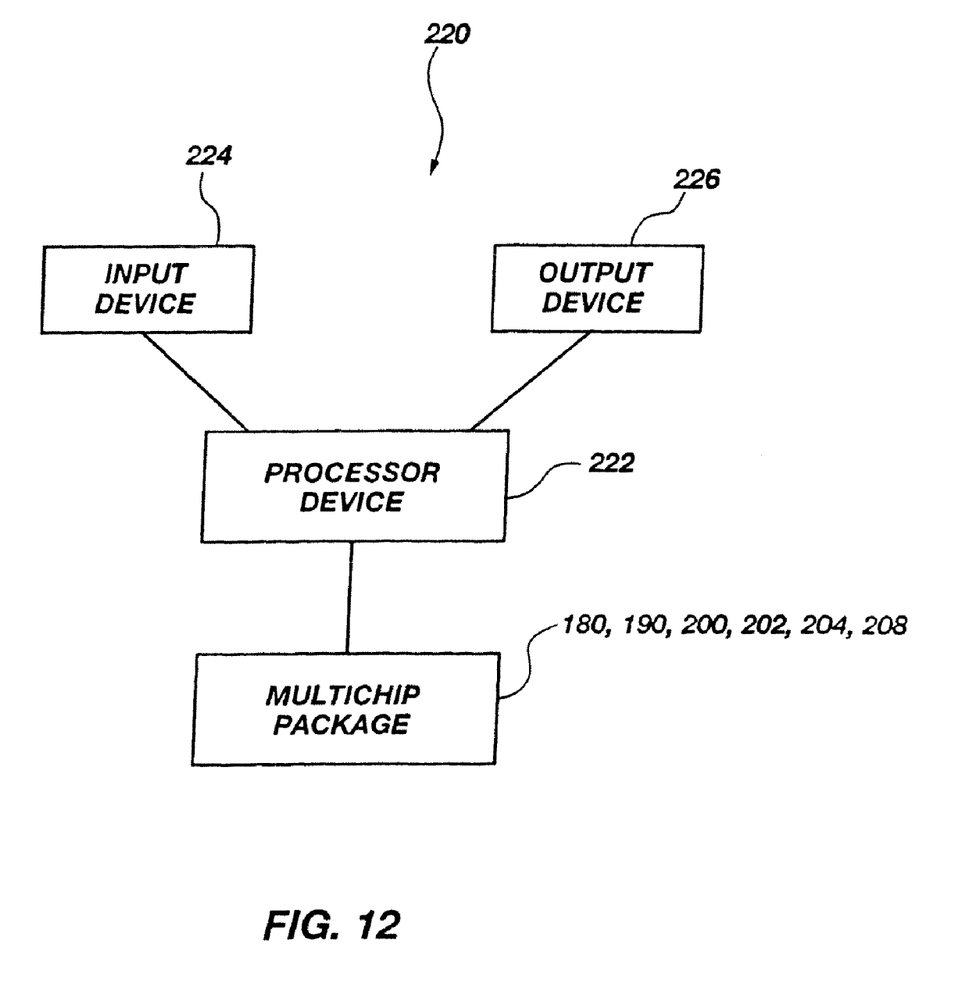
FIG. 12 is a schematic showing a multichip package employed in a computer environment according to an embodiment of the present invention.

It is further noted that any of the above-described multichip packages may be utilized in a computer environment. For example, referring to FIG. 12, a multichip package or arrangement 180, 190, 200, 202, 204 and/or 208 may be configured as memory devices and incorporated into a computing system 220, which may further include, for example, a processor device 222, such as a central processing unit or other logic device, operably coupled with the memory device(s). The processor device may also be coupled with one or more appropriate input devices 224 (e.g., mouse, keyboard, hard drive, microphone, etc.) and one or more output devices 226 (e.g., monitor, printer, speaker, etc.). It is particularly noted that the multichip packages may be utilized in environments requiring relatively large amounts of memory configured in a small volume or package such as, for example, cell phones, personal data assistants (PDAs), and other similar devices.

Figure 13:
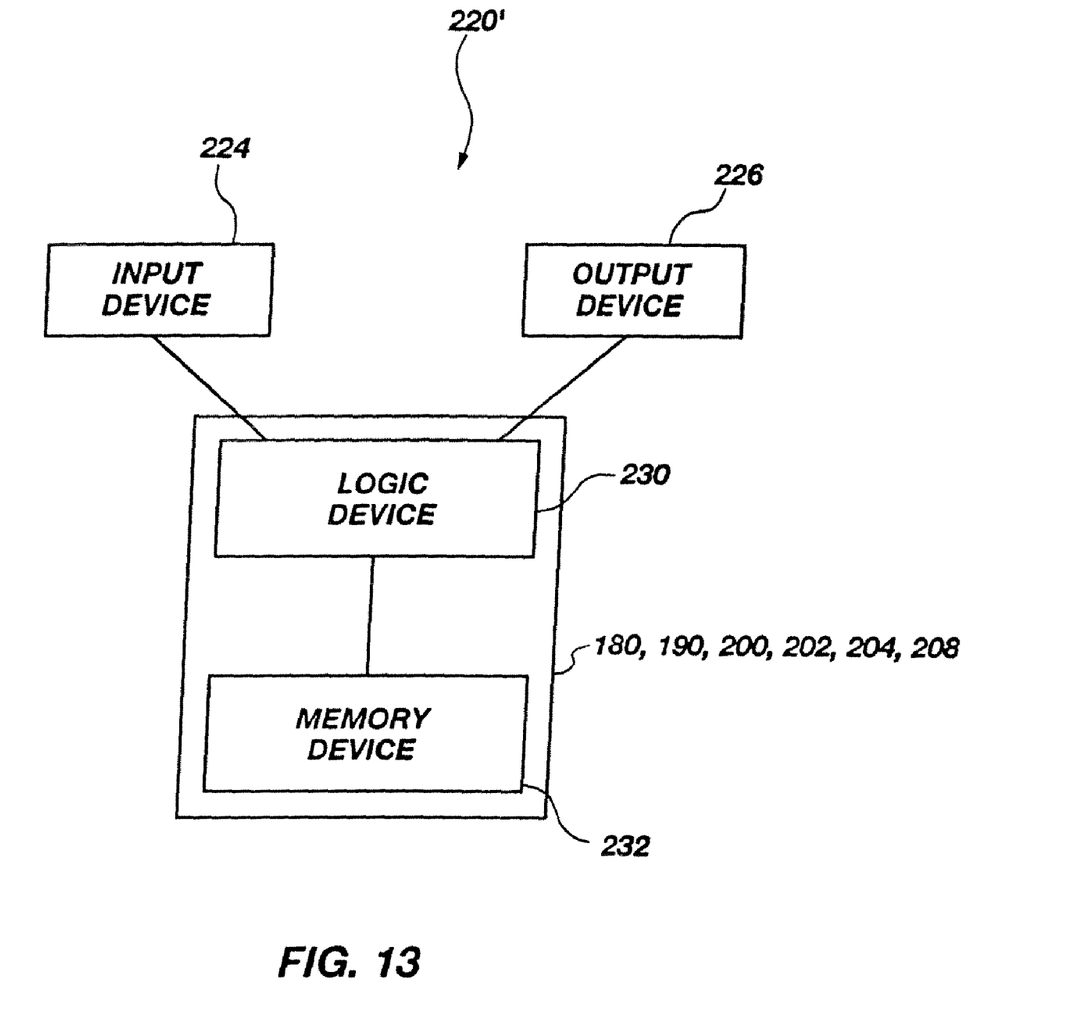
FIG. 13 is a schematic showing a multichip package according to another embodiment of the present invention.

Referring briefly to FIG. 13, in another embodiment, a multichip package or arrangement 180, 190, 200, 202, 204 and/or 208 may be configured to include a die configured as a logic device 230 and a die configured as a memory device 232, such as described above, and independently coupled with one or more input devices 224 and one or more output devices 226 as part of a specified computer system 220'.

The above-illustrated embodiments of the present invention, and variations thereof, provide die-wafer packaging or multichip packaging of semiconductor dice including stacked arrangements configured for flip-chip mounting or attachment to an external device. Although the present invention has been depicted and described with respect to the illustrated embodiments, various additions, deletions and modifications are contemplated within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. A method of fabricating a semiconductor device package comprising:
   fabricating a wafer having at least one semiconductor die site, the at least one semiconductor die site having a plurality of bond pads including at least a first set of bond pads and a second set of bond pads;
   fabricating at least one singulated semiconductor die having a first plurality of bond pads disposed on a first surface thereof, each of the first plurality of bond pads including an under-bump metallization layer, and a second plurality of bond pads disposed on a second, opposing surface thereof, each of the second plurality of bond pads including an under-bump metallization layer; and
   placing a first plurality of conductive bumps between the first set of bond pads of the at least one semiconductor die site and at least some of the first plurality of bond pads of the at least one singulated semiconductor die.

2. The method according to claim 1, further comprising placing a second plurality of conductive bumps on the second set of bond pads of the at least one semiconductor die site connecting the second plurality of conductive bumps therewith.

3. The method according to claim 2, further comprising placing a third plurality of conductive bumps on the second plurality of bond pads of the at least one singulated semiconductor die connecting the third plurality of conductive bumps therewith.

4. The method according to claim 3, further comprising depositing at least one passivation layer over the second, opposing surface of the at least one singulated semiconductor die and at least a portion of the at least one semiconductor die site.

5. The method according to claim 4, further comprising exposing a portion of each of the second plurality of conductive bumps and a portion of each of the third plurality of conductive bumps through the at least one passivation layer.

6. The method according to claim 5, wherein exposing a portion of each of the second plurality of conductive bumps and a portion of each of the third plurality of conductive bumps through the at least one passivation layer includes subjecting at least a portion of the at least one passivation layer to a planarization process.

7. The method according to claim 6, wherein subjecting at least a portion of the at least one passivation layer to a planarization process includes mechanically planarizing the at least a portion of the at least one passivation layer.

8. The method according to claim 6, wherein subjecting at least a portion of the at least one passivation layer to a planarization process includes subjecting the at least a portion of the at least one passivation layer to a chemical-mechanical planarization process.

9. The method according to claim 5, wherein exposing a portion of each of the second plurality of conductive bumps and a portion of each of the third plurality of conductive bumps through the at least one passivation layer includes etching at least a portion of the at least one passivation layer.

10. The method according to claim 5, further comprising singulating the at least one semiconductor die site and the at least one singulated semiconductor die from a remainder of the wafer.

11. A method of fabricating a semiconductor device package comprising:
 disposing a first plurality of conductive bumps coupling a first set of bond pads of at least one semiconductor die site of a wafer, the at least one semiconductor die site of the wafer having a plurality of bond pads including at least the first set of bond pads and a second set of bond pads, with at least some of a first plurality of bond pads of at least one singulated semiconductor die, each of the first plurality of bond pads including an under-bump metallization layer, the at least one singulated semiconductor die having a second plurality of bond pads disposed on a second, opposing surface thereof, each of the second plurality of bond pads including an under-bump metallization layer.

12. The method of claim 11, further comprising disposing a second plurality of conductive bumps on the second set of bond pads of the at least one semiconductor die site connecting the second plurality of conductive bumps therewith.

13. The method of claim 12, further comprising disposing a third plurality of conductive bumps on the second plurality of bond pads of the at least one singulated semiconductor die connecting the third plurality of conductive bumps therewith.

14. The method of claim 13, further comprising forming at least one passivation layer over at least a portion of the at least one semiconductor die site.

15. The method of claim 14, further comprising exposing a portion of each of the second plurality of conductive bumps and a portion of each of the third plurality of conductive bumps through the at least one passivation layer.

16. The method of claim 15, wherein exposing a portion of each of the second plurality of conductive bumps and a portion of each of the third plurality of conductive bumps includes using a planarization process.

17. A method of forming a semiconductor device package comprising:
 forming a wafer having at least one semiconductor die site, the at least one semiconductor die site having a plurality of bond pads including at least a first set of bond pads and a second set of bond pads;
 forming at least one singulated semiconductor die having a first plurality of bond pads on a first surface thereof, each of the first plurality of bond pads including an under-bump metallization layer, and a second plurality of bond pads disposed on a second, opposing surface thereof, each of the second plurality of bond pads including an under-bump metallization layer; and
 forming a first plurality of conductive bumps between and electrically coupling the first set of bond pads of the at least one semiconductor die site with at least some of the first plurality of bond pads of the at least one singulated semiconductor die.

18. The method of claim 17, further comprising:
attaching a second semiconductor die to the at least one singulated semiconductor die.

19. The method of claim 17, further comprising:
attaching a second semiconductor die to another semiconductor die site on the wafer.

20. The method of claim 19, further comprising:
attaching a third semiconductor die to one of the at least one singulated semiconductor die and the second semiconductor die.

* * * * *

UNITED STATES PATENT AND TRADEMARK OFFICE
CERTIFICATE OF CORRECTION

PATENT NO. : 7,807,503 B2
APPLICATION NO. : 12/194261
DATED : October 5, 2010
INVENTOR(S) : Trung T. Doan It is certified that error appears in the above-identified patent and that said Letters Patent is hereby corrected as shown below:

On the Title page, item (75), in "Inventor", in column 1, delete "Vellejo, CA" and insert -- Vallejo, CA --, therefor.

Signed and Sealed this

Seventh Day of December, 2010

David J. Kappos
*Director of the United States Patent and Trademark Office*